(12) United States Patent
Skotnicki et al.

(10) Patent No.: US 6,507,091 B1
(45) Date of Patent: Jan. 14, 2003

(54) TRANSISTOR WITH INDIUM-IMPLANTED SIGE ALLOY AND PROCESSES FOR FABRICATING THE SAME

(75) Inventors: Thomas Skotnicki, Crolles Montfort (FR); Jérôme Alieu, Isle D'Abeau (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/515,787

(22) Filed: Feb. 29, 2000

(30) Foreign Application Priority Data

Mar. 1, 1999 (FR) .............................................. 99 02513

(51) Int. Cl.⁷ ................. H01L 31/0328; H01L 31/0376; H01L 31/0256; H01L 31/117; H01L 31/20
(52) U.S. Cl. .......................... 257/613; 257/19; 257/55; 257/63; 257/613; 257/616
(58) Field of Search ................. 257/616, 613, 257/19, 55, 63

(56) References Cited

U.S. PATENT DOCUMENTS 5,272,365 A * 12/1993 Nakagawa ................... 257/192

FOREIGN PATENT DOCUMENTS

WO          WO97/23000          6/1997

OTHER PUBLICATIONS

P. Bouillon et al., "Re–examination of Indium Implantation for a Low Power O. 1 μm Technology" Technical Digest of the International Electron Devices Meeting (IEDM), Dec. 10–13, 1995, pp. 897–900, XP000624815.

P. Bouillon et al., "Anomalous Short Channel Effects in Indium Implanted nMOSETs", International Electron Devices Meeting 1997, IEDM Technical Digest, Dec. 7–20, 1997, pp. 231–234, XP002118637.

Preliminary Search Report dated Oct. 13, 1999 with annex on French Application No. 99/02513.

* cited by examiner

*Primary Examiner*—Wael Fahmy
*Assistant Examiner*—Ida M. Soward
(74) *Attorney, Agent, or Firm*—Lisa K. Jorgenson; Stephen Bongini; Fleit, Kain, Gibbons, Gutman & Bongini P.L.

(57) ABSTRACT

An indium-implanted transistor is provided. The transistor has a silicon channel region that includes a buried layer of an $Si_{1-x}Ge_x$ alloy into which indium is implanted, with $10^{-5} \leq x \leq 4 \times 10^{-1}$. A first method for fabricating an indium-implanted transistor is also provided. A multilayer composite film is produced on at least one region of a surface of a silicon substrate where a channel region of the transistor is to be formed. The multilayer composite film includes at least one $Si_{1-x}Ge_x$ alloy layer, in which $10^{-5} \leq x \leq 4 \times 10^{-1}$, and an external silicon layer. Indium is implanted into the $Si_{1-x}Ge_x$ alloy layer, and fabrication of the transistor is completed so as to produce the transistor with a channel region that includes a buried $Si_{1-x}Ge_x$ alloy layer. Additionally, a second method for fabricating an indium-implanted transistor is provided. Germanium is implanted into at least one region of a silicon substrate where a channel region of a transistor is to be formed, in order to form a buried layer of an $Si_{1-x}Ge_x$ alloy in which $10^{-5} \leq x \leq 4 \times 10^{-1}$. Indium is implanted into the $Si_{1-x}Ge_x$ alloy layer, and fabrication of the transistor is completed so as to produce the transistor with a channel region that includes a buried $Si_{1-x}Ge_x$ alloy layer.

22 Claims, 7 Drawing Sheets

TRANSISTOR WITH INDIUM-IMPLANTED SIGE ALLOY AND PROCESSES FOR FABRICATING THE SAME

CROSS-REFERENCE TO RELATED APPLICATIONS

This application is based upon and claims priority from prior French Patent Application No. 99-02513, filed Mar. 1, 1999, the entire disclosure of which is herein incorporated by reference.

BACKGROUND OF THE INVENTION

1. Field of the Invention

The present invention relates to transistors, and more specifically to a transistor having indium implanted into an SiGe alloy and a process for fabricating such a transistor.

2. Description of Related Art

One conventional technique for adjusting the threshold voltage of a conventional silicon transistor in order to improve its performance characteristics is to implant heavy ions, such as indium and arsenic, into the silicon channel of the transistor. These dopants make it possible to better control the drop in threshold voltage when the dimensions of the transistor decrease (the short-channel effect), and the degradation of the below-the-threshold slope. In addition, indium provides other advantageous effects with regard to the variation of the threshold voltage in long transistors (usually this voltage does not vary in long transistors).

The implantation of indium into the silicon of the channel initially has an advantageous retrograde profile. However, during subsequent heat treatments that are required to fabricate the transistor, the implanted indium diffuses so as to degrade the initial retrograde profile. Furthermore, in the fabricated transistor, the indium becomes electrically active in the silicon poorly. In other words, the profile of the electrically active implanted indium is substantially different from the chemical profile of the indium implantation.

SUMMARY OF THE INVENTION

In view of these drawbacks, it is an object of the present invention to overcome the above-mentioned drawbacks and to provide an indium-implanted transistor that has improved characteristics as compared with conventional transistors. Such characteristics can include the threshold voltage ($V_{th}$), the below-the-threshold slope (S), the short-channel effect (SCE), and/or the drain-induced barrier lowering (DIBL).

Another object of the present invention is to provide an indium-implanted transistor having a retrograde stable implanted indium profile that is similar to the initial chemical profile of the implanted indium.

Yet another object of the present invention is to provide a process for fabricating an indium-implanted transistor with improved characteristics.

One embodiment of the present invention provides an indium-implanted transistor having a silicon channel region that includes a buried layer of an $Si_{1-x}Ge_x$ alloy into which indium is implanted, with $10^{-5} \leq x \leq 4 \times 10^{-1}$. In a preferred embodiment, $10^{-4} \leq x \leq 10^{-1}$, and the implanted indium is in the range of from $1 \times 10^{11}$ to $4 \times 10^{15}$ atoms/cm$^2$.

Another embodiment of the present invention provides a first method for fabricating an indium-implanted transistor. According to the first method, a multilayer composite film is produced on at least one region of a surface of a silicon substrate where a channel region of the transistor is to be formed. The multilayer composite film includes at least one $Si_{1-x}Ge_x$ alloy layer, in which $10^{-5} \leq x \leq 4 \times 10^{-1}$, and an external silicon layer. Indium is implanted into the $Si_{1-x}Ge_x$ alloy layer, and fabrication of the transistor is completed so as to produce the transistor with a channel region that includes a buried $Si_{1-x}Ge_x$ alloy layer into which the indium is implanted. In one preferred method, the multilayer composite film is a three-layer film that includes a silicon layer between the surface of the substrate and the $Si_{1-x}Ge_x$ alloy layer.

Yet another embodiment of the present invention provides a second method for fabricating an indium-implanted transistor. According to the second method, germanium is implanted into at least one region of a silicon substrate where a channel region of a transistor is to be formed, in order to form a buried layer of an $Si_{1-x}Ge_x$ alloy in which $10^{-5} \leq x \leq 4 \times 10^{-1}$. Indium is implanted into the $Si_{1-x}Ge_x$ alloy layer, and fabrication of the transistor is completed so as to produce the transistor with a channel region that includes a buried $Si_{1-x}Ge_x$ alloy layer into which the indium is implanted. In one preferred method, the implanted germanium is in the range of from $10^{12}$ to $10^{16}$ atoms/cm$^2$, and the germanium implantation energy is from 20 to 300 keV.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Figure 1:
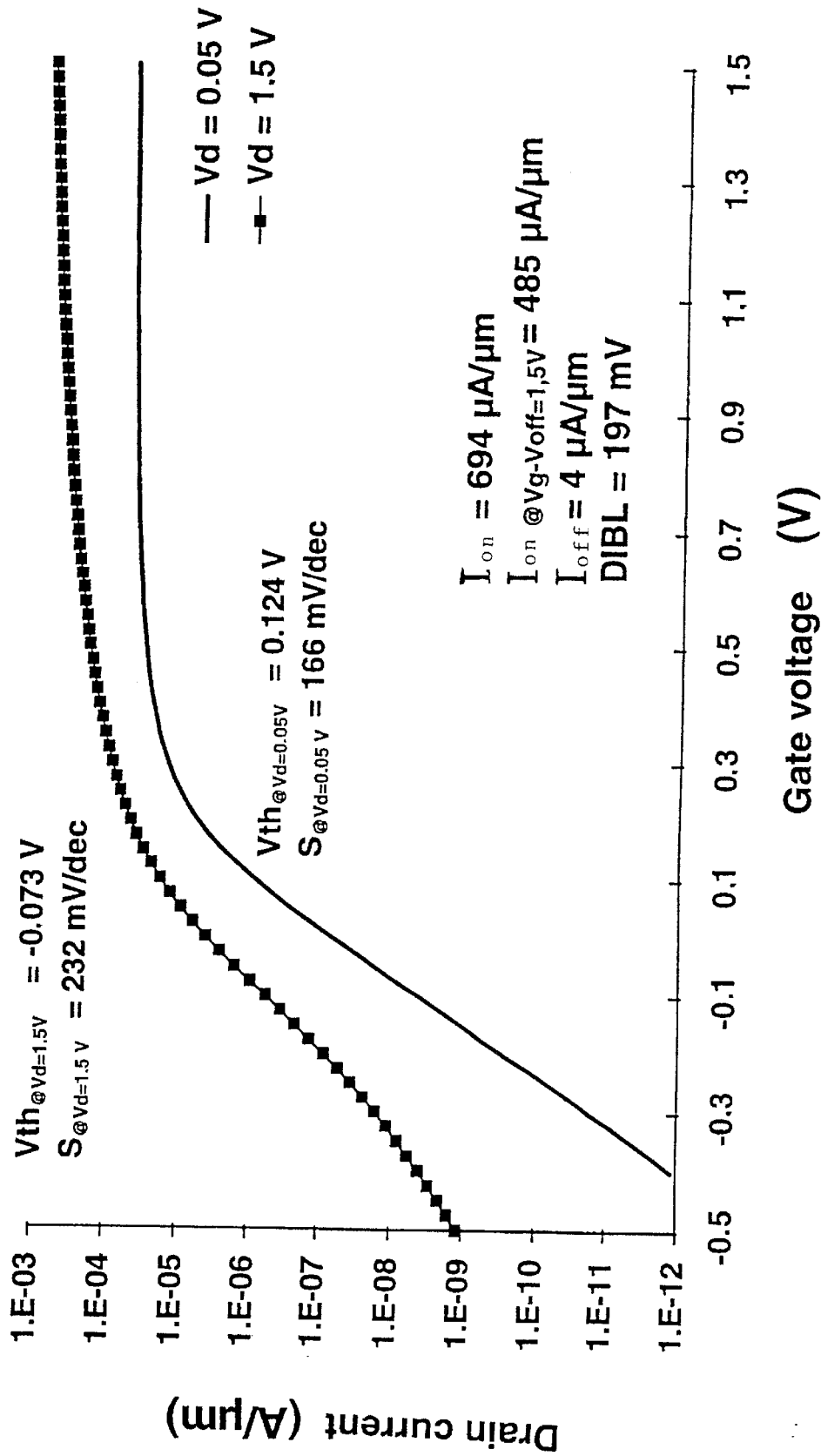
FIG. 1 is a graph of drain current ($I_d$) as a function of gate voltage ($V_g$) for an NMOS transistor with standard indium implantation and a gate length (Lg) of 0.11 μm.

Preferred embodiments of the present invention will be described in detail hereinbelow with reference to the attached drawings.

A preferred embodiment of the present invention provides an indium-implanted transistor having a silicon channel region that includes a buried layer of an $Si_{1-x}Ge_x$ alloy, where $10^{-5} \leq x \leq 4 \times 10^{-1}$, and preferably $10^{-4} \leq x \leq 10^{-1}$. A dose of indium is implanted into the buried $Si_{1-x}Ge_x$ alloy layer, generally with from $1 \times 10^{11}$ atoms/cm² to $4 \times 10^{15}$ atoms/cm², and preferably with from $5 \times 10^{12}$ atoms/cm² to $5 \times 10^{13}$ atoms/cm². The transistor of the preferred embodiment of the present invention has a stable retrograde electrically active indium implantation profile that is very similar to the chemical implantation profile of the indium and provides significantly improved properties (such as the threshold voltage, the below-the-threshold slope, the short-channel effect, and the drain-induced barrier lowering).

The present invention also provides processes for fabricating indium-implanted transistors. In a first embodiment of the fabrication process of the present invention, a multilayer composite film is produced on at least one region of the surface of a silicon substrate where a channel region of the transistor is to be formed. The multilayer composite film includes at least one $Si_{1-x}Ge_x$ alloy layer in which $10^{-5} \leq x \leq 4 \times 10^{-1}$, and preferably $10^{-4} \leq x \leq 10^{-1}$, and an external silicon layer o $Si_{1-x}Ge_x$ alloy layer. A dose of indium is implanted into the $Si_{1-x}Ge_x$ alloy layer, and then fabrication of the transistor is completed in a conventional manner so as to produce a transistor whose channel region includes a buried $Si_{1-x}Ge_x$ alloy layer into which the dose of indium is implanted.

In one preferred fabrication process, the multilayer composite film is a three-layer composite film that includes (in succession from the surface of the substrate) a silicon first layer, an $Si_{1-x}Ge_x$ alloy second layer, and a silicon third layer. The thickness of the $Si_{1-x}Ge_x$ alloy layer must be sufficient to allow suitable implantation of the indium (e.g., on the order of 60 nm). Additionally, the silicon layer on the $Si_{1-x}Ge_x$ alloy layer must have a sufficient thickness (e.g., on the order of at least 5 nm). If a three-layer composite film is used, the thickness of the silicon first layer is not critical, but is generally less than 100 nm.

The additional external silicon layer makes the fabrication process of the first embodiment compatible with the steps of the conventional transistor fabrication process, and especially with the oxidation steps. The multilayer film can be produced in a conventional manner using selective or nonselective epitaxy. In conventional transistor fabricating processes, it is common to produce trenches that are filled with an insulating material. The etching of the trenches and their filling with an insulating material (for example, $SiO_2$) can be carried out either before or after formation of the multilayer film. The completion of the transistor then takes place using the usual steps of the conventional fabrication process.

In a second embodiment of the fabrication process of the present invention, a dose of germanium is implanted into at least one region of a silicon substrate where a channel region of a transistor is to be formed, so as to form in the region a buried layer of an $Si_{1-x}Ge_x$ alloy in which $10^{-5} \leq x \leq 4 \times 10^{-1}$, and preferably $10^{-4} \leq x \leq 10^{-1}$. A dose of indium is implanted into the $Si_{1-x}Ge_x$ alloy layer, and then fabrication of the transistor is completed in a conventional manner so as to produce a transistor whose channel region includes a buried $Si_{1-x}Ge_x$ alloy layer into which the dose of indium is implanted.

In the fabrication process of the second embodiment, the dose of germanium must be sufficient to obtain an $Si_{1-x}Ge_x$ layer having the desired composition and the implantation must be such that the $Si_{1-x}Ge_x$ layer is buried at a suitable depth (e.g., at a depth of at least 5 nm). The germanium implantation can be carried out by any conventional implantation process that allows the desired $Si_{1-x}Ge_x$ layer to be obtained. For example, conventional germanium implantation with doses of from $10^{12}$ atoms/cm² to $10^{16}$ atoms/cm² and energies of from 20 keV to 300 keV are sufficient to produce the desired buried $Si_{1-x}Ge_x$ layer. The completion of the transistor takes place using the usual steps of the conventional fabrication process. Further, as in the first embodiment, trenches can be etched and filled with insulating material either before or after the formation of the buried $Si_{1-x}Ge_x$ alloy layer.

Figure 2:
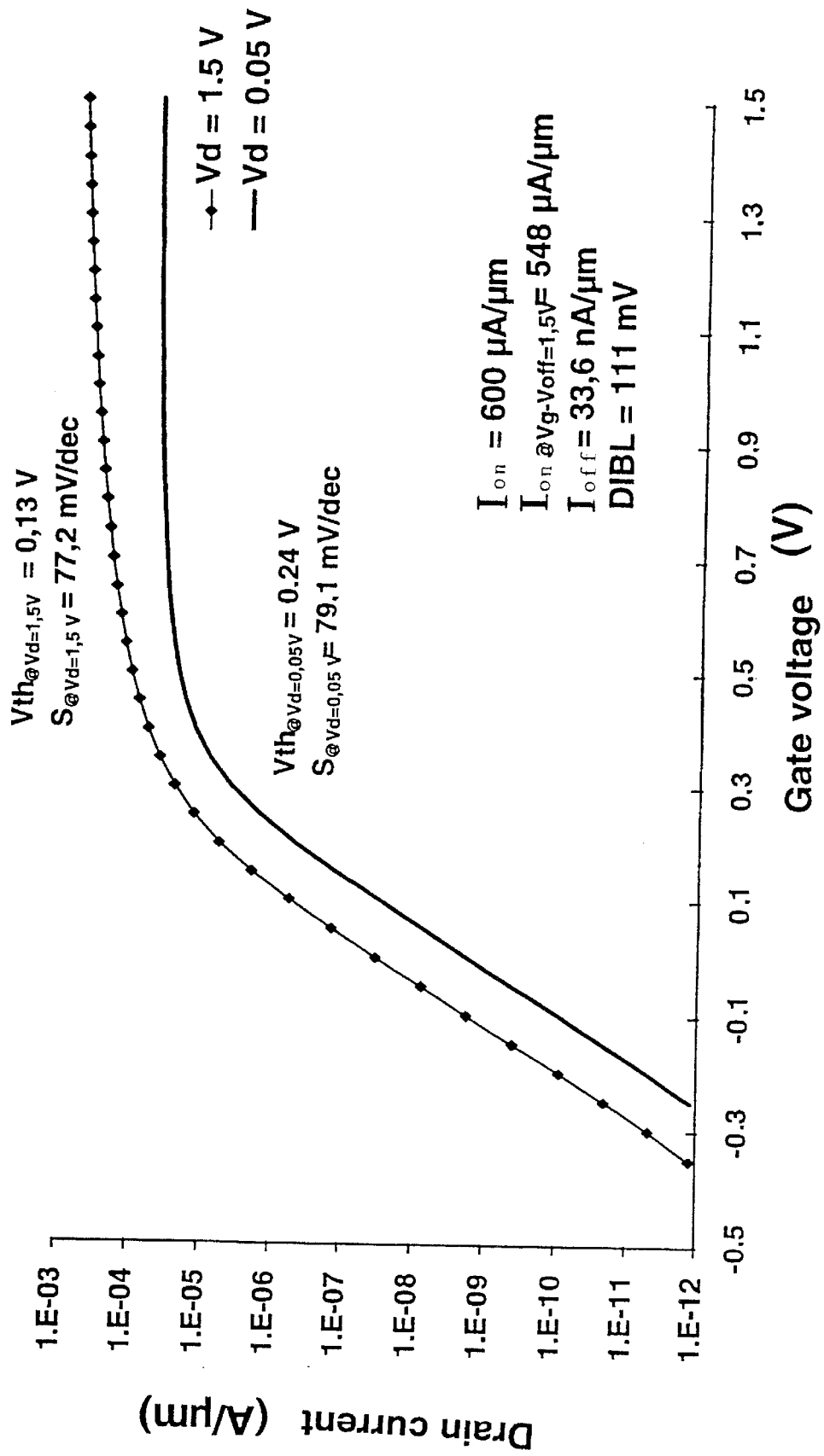
FIG. 2 is a graph of drain current ($I_d$) as a function of gate voltage ($V_g$) for an NMOS transistor with indium implantation into an $Si_{1-x}Ge_x$ layer (x=0.07) and a gate length (Lg) of 0.11 μm in accordance with an exemplary embodiment of the present invention.

An exemplary embodiment of the present invention will now be described with reference to FIGS. 1, 2, and 3. Two indium-implanted NMOS transistors having a gate width of 18 μm and a gate length of 0.11 μm were fabricated. The first transistor (T1) is a conventional indium-implanted transistor in which the indium is implanted into a channel region made of pure silicon. The second transistor (T2) is a indium-implanted transistor according to an exemplary embodiment of the present invention in which a buried $Si_{1-x}Ge_x$ (x=0.07) alloy layer is produced according to the fabrication process of the first embodiment of the present invention using selective epitaxial deposition of an Si(50 nm)/$Si_{1-x}Ge_x$ (60 nm)/Si(10 nm) three-layer film on a silicon substrate. The indium implantation was carried out conventionally under the same conditions for both transistors T1 and T2, with an implantation energy of 170 keV and an implanted dose of $10^{13}$ atoms/cm². The characteristics of the two resulting transistors T1 and T2 were compared, and the results are given in below in Table I.

TABLE I

| Characteristic | Transistor T1 | Transistor T2 |
|---|---|---|
| As-measured saturation current (μA/μm) | 890 | 675 |
| Linear threshold voltage at $V_d$ = 0.05 V (V) | 0.114 | 0.274 |
| Off-state current (A/μm) | $4.9 \times 10^{-5}$ | $5.5 \times 10^{-7}$ |
| Saturation current normalized to $V_g - V_{th}$ = 1.1 V (μA/μm) | 538 | 531 |
| Saturation current normalized to $V_{off}$ + 1.5 V ($V_{off}$ such that $I_d$ = 1 nA/μm) (μA/μm) | 460 | 560 |
| S at high $V_d$ (1.5 V) (mV/decade) | 386 | 85 |
| Short-channel effect (SCE + DIBL) (mV) | 526 | 369 |
| Substrate effect (V½) | 0.042 | 0.111 |

$V_d$ = Drain Voltage
$V_g$ = Gate Voltage
$V_{th}$ = Threshold Voltage
$V_{off}$ = Leakage Voltage
$I_d$ = Drain Current
$I_{on}$ = Supply Current
$I_{off}$ = Leakage Current
S = Below-The-Threshold Slope
SCE = Short-Channel Effect
DIBL = Drain-Induced Barrier Lowering The results in Table I show that the transistor T2 of the present invention has significantly improved characteristics, such as a higher threshold voltage (and therefore a smaller leakage current), a lower below-the-threshold slope, and reduced small-size effects (SCE and DIBL). FIGS. 1 and 2 show the drain current ($I_d$) as a function of the gate voltage ($V_g$) for low and high drain voltages ($V_d$) for transistors T1 and T2, respectively. As shown in FIGS. 1 and 2, the transistor T2 of the present invention has below-the-threshold slopes (S) which are much better than those of the conventional transistor T1 and which approach the ideal value of 60 mV/decade.

Figure 3:
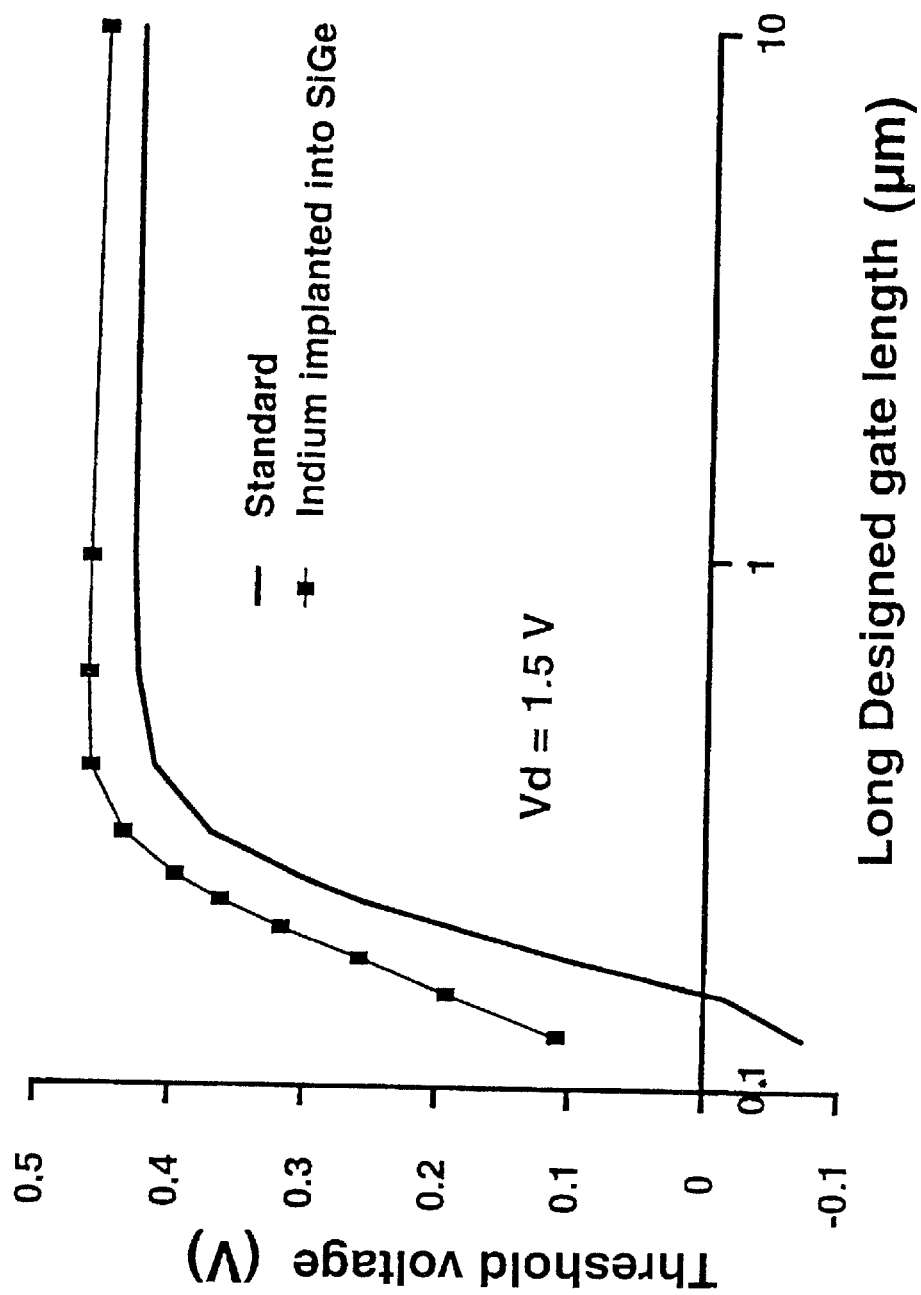
FIG. 3 is a graph of threshold voltage ($V_{th}$) as a function of gate length for the transistors of FIGS. 1 and 2.

FIG. 3 is a graph of the threshold voltage ($V_{th}$) as a function of the gate length for the two transistors T1 and T2, As shown, the indium implantation into an SiGe alloy layer according to the present invention results in higher electrically active doping, and hence better control of the short-channel effect.

Figure 4:
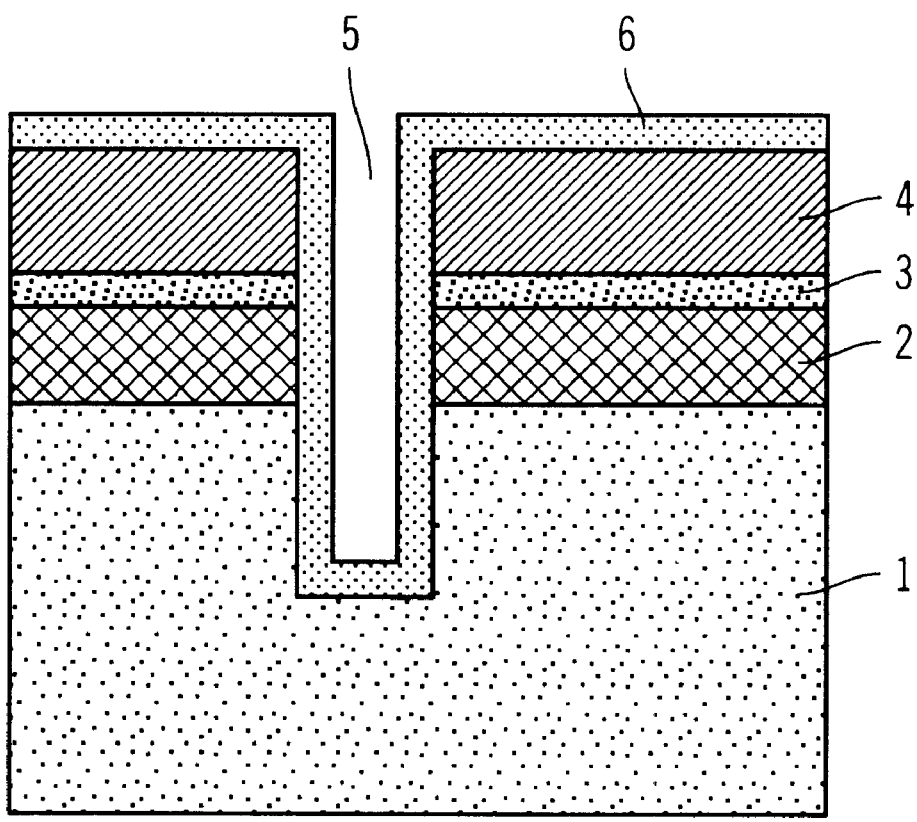
FIG. 4 is a diagram illustrating a first embodiment of the fabrication process of the present invention that utilizes non-selective epitaxy of the three-layer film before isolating trenches are formed.

FIG. 4 shows a first embodiment of the fabrication process of the present invention. This implementation of the first embodiment of the fabrication process starts with the non-selective epitaxial deposition of a three-layer film 2 on the surface of a silicon substrate 1. The film 2 includes a silicon first layer, an $Si_{1-x}Ge_x$ ($10^{-5} \leq x \leq 4 \times 10^{-1}$) alloy second layer, and a silicon third layer. The percentage of germanium and the thickness of the $Si_{1-x}Ge_x$ layer are chosen so as to satisfy the condition of non-relaxation of the mechanical stress. As explained above, the two silicon layers make the process compatible with the steps of conventional processes for fabricating transistors, and in particular the oxidation steps.

The indium implantation is then carried out in the manner described above. Next, a hard mask is formed by conventionally producing superposed layers of silicon oxide 3 and silicon nitride 4 and photolithographically patterning these two layers. Then, the trench 5 is etched by any conventional process. This is conventionally followed by filling the trench 5 with an insulating material such as $SiO_2$ and completing the transistor using the steps of the conventional process. However, since germanium is highly reactive with respect to oxygen, it is preferable to isolate the $SiO_2$ with a layer of an encapsulation material (for example, silicon oxynitride) before the trench 5 is filled with $SiO_2$. This prevents any interaction between the $SiO_2$ filling the trench and the germanium of the three-layer film.

Figure 5:
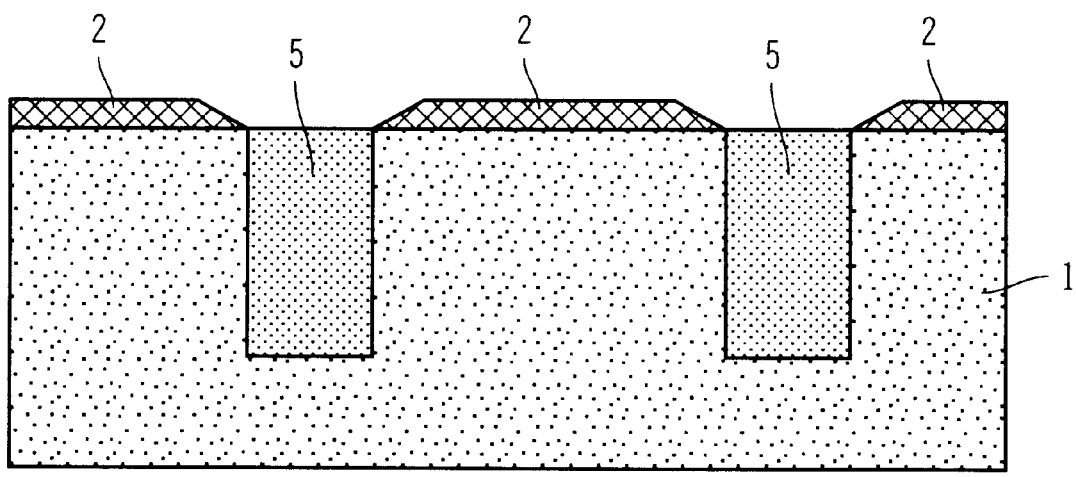
FIG. 5 is a diagram illustrating a first embodiment of the fabrication process of the present invention that utilizes selective epitaxy of the three-layer film after isolating trenches have been formed.

FIG. 5 shows another implementation of the first embodiment of the fabrication process that utilizes selective epitaxy of the three-layer film. This implementation starts by conventionally forming trenches 5 in the silicon substrate 1 and then filling them with an insulating material. The three-layer film 2 of the present invention is then deposited by selective epitaxy. Thus, the three-layer film can be epitaxially deposited on n-type and p-type active regions. If it is desired to carry out epitaxy on only the n-type active regions, it would then be necessary to mask the p-type active regions. Indium is then implanted into the three-layer film in the manner described above, and then the transistor is completed using the conventional fabrication process.

Figure 6A:
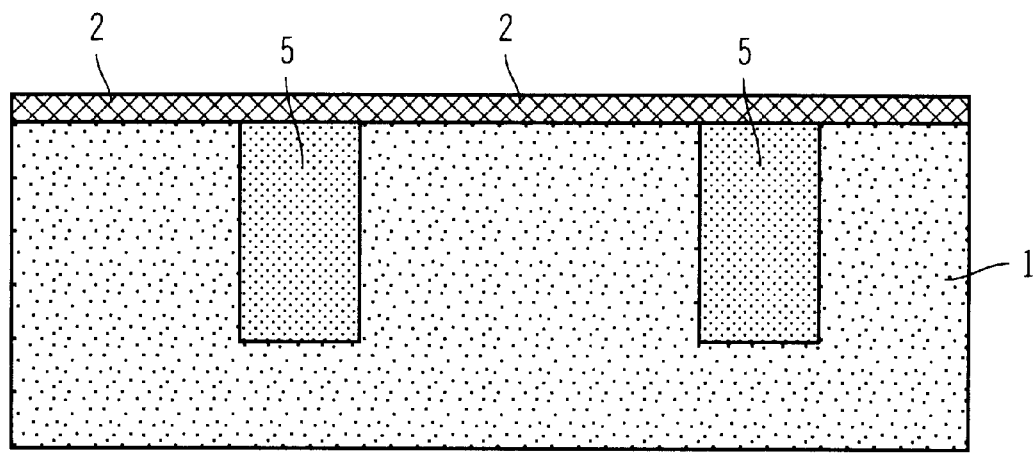
FIGS. 6a and 6b are diagrams illustrating a first embodiment of the fabrication process of the present invention that utilizes non-selective epitaxy of the three-layer film after trenches have been formed.
Figure 6B:
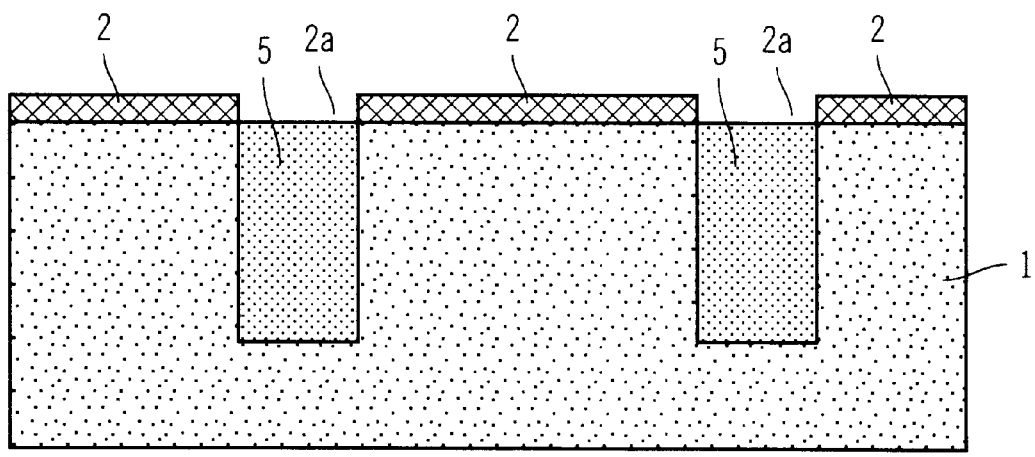

FIGS. 6a and 6b show another implementation of the first embodiment of the fabrication process that utilizes non-selective epitaxy of the three-layer film and prior formation of the isolating trenches. As previously, the process starts by etching the substrate 1 in order to form trenches 5 which are then filled with an insulating material (for example, $SiO_2$). Then, non-selective epitaxial deposition is used to form a continuous three-layer film 2 (i.e., over the entire surface). Next, the three-layer film 2 is conventionally etched (e.g., using a photolithographically patterned mask), with the etching stopping on the oxide so as to remove the three-layer film 2 over the isolating trenches 5. Then, as described above, indium is implanted and the transistor is completed. The same mask may be used to etch the trenches 5 and then the three-layer film 2.

Figure 7:
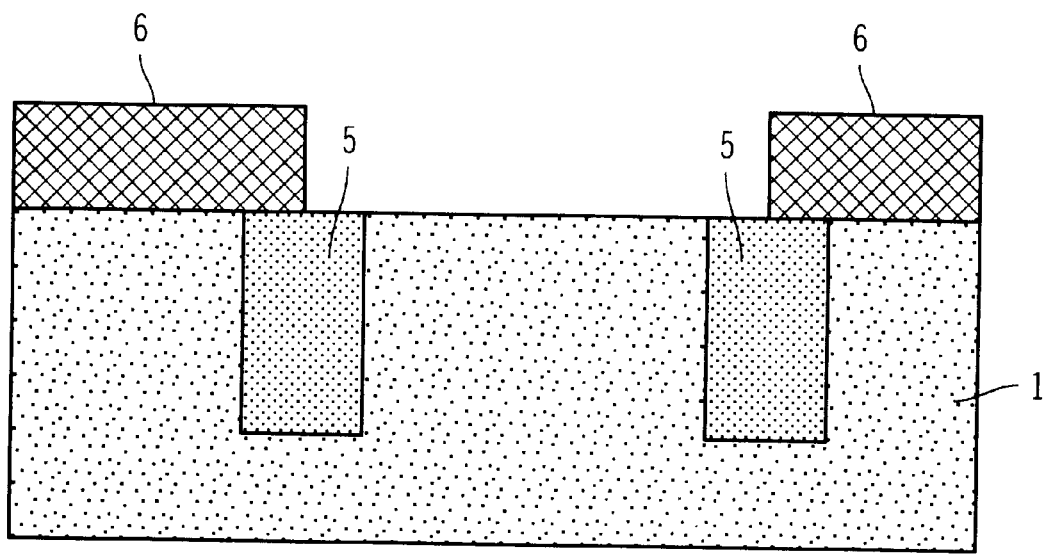
FIG. 7 is a diagram illustrating a second embodiment of the fabrication process of the present invention.

FIG. 7 shows a second embodiment of the fabrication process of the present invention in which germanium is implanted into a silicon substrate. After forming isolating trenches 5 in a silicon substrate 1 in the manner described above, an appropriately patterned resin mask 6 is formed on the surface. Additionally, germanium is implanted as described above in order to form the $Si_{1-x}Ge_x$ alloy layer of the present invention. Indium is then implanted and the transistor is completed in a conventional manner. The second embodiment has the advantages of being simple, rapid, and selective, and of allowing very low germanium concentrations.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An indium-implanted transistor comprising:
   a silicon channel region that includes a buried layer of an $Si_{1-x}Ge_x$ alloy into which indium is implanted,
   wherein $10^{-5} \leq x \leq 4 \times 10^{-1}$,
   the buried layer of an $Si_{1-x}Ge_x$ alloy is part of a multilayer composite film formed on a surface of a silicon substrate, and
   the multilayer composite film includes at least the one $Si_{1-x}Ge_x$ alloy layer and an external silicon layer, the silicon layer being between the surface of the substrate and the $Si_{1-x}Ge_x$ alloy layer.

2. The transistor as defined in claim 1, wherein $10^{-4} \leq x \leq 10^{-1}$.

3. The transistor as defined in claim 1, wherein the implanted indium is in the range of from $1 \times 10^{11}$ to $4 \times 10^{15}$ atoms/cm$^2$.

4. The transistor as defined in claim 1, wherein the implanted indium is in the range of from $5 \times 10^{12}$ to $5 \times 10^{13}$ atoms/cm$^2$.

5. The transistor as defined in claim 1, wherein the implanted indium has a stable, retrograde, electrically active implantation profile that is substantially similar to the retrograde chemical implantation profile of the indium.

6. The indium-implanted transistor as defined in claim 1, wherein the indium-implanted transistor is fabricated by a method comprising the steps of:
   producing a multilayer composite film on at least one region of a surface of a silicon substrate where the channel region of the transistor is to be formed, the multilayer composite film including at least one $Si_{1-x}Ge_x$ alloy layer, in which $10^{-5} \leq x \leq 4 \times 10^{-1}$, and an external silicon layer;
   implanting indium into the $Si_{1-x}Ge_x$ alloy layer; and
   completing fabrication of the transistor so as to produce the transistor with the channel region that includes the buried $Si_{1-x}Ge_x$ alloy layer into which the indium is implanted.

7. The indium-implanted transistor as defined in claim 6, wherein $10^{-4} \leq x \leq 10^{-1}$.

8. The indium-implanted transistor as defined in claim 6, wherein the implanted indium is in the range of from $1 \times 10^{11}$ to $4 \times 10^{15}$ atoms/cm$^2$.

9. The indium-implanted transistor as defined in claim 6, wherein the external silicon layer of the multilayer film has a thickness of at least 5 nm.

10. The indium-implanted transistor as defined in claim 6, wherein the step of producing the multilayer composite film includes the sub-step of depositing the layers of the multilayer composite film by selective or non-selective epitaxy.

11. The indium-implanted transistor as defined in claim 10, wherein the method further comprises the steps of:
   etching isolation trenches; and
   filling the isolation trenches with an insulating material,
   wherein the etching and filling steps are performed before or after the deposition of the multilayer composite film.

12. The indium-implanted transistor as defined in claim 6, wherein the method further comprises the steps of:
   etching isolation trenches; and
   filling the isolation trenches with an insulating material,
   wherein the etching and filling steps are performed before or after the production of the multilayer composite film.

13. The indium-implanted transistor as defined in claim 1, wherein the indium-implanted transistor is fabricated by a method comprising the steps of:
   implanting germanium into at least one region of a silicon substrate where the channel region of the transistor is to be formed, in order to form the buried layer of the $Si_{1-x}Ge_x$ alloy in which $10^{-5} \leq x \leq 4 \times 10^{-1}$;
   implanting indium into the $Si_{1-x}Ge_x$ alloy layer; and
   completing fabrication of the transistor so as to produce the transistor with the channel region that includes the buried $Si_{1-x}Ge_x$ alloy layer into which the indium is implanted.

14. The indium-implanted transistor as defined in claim 13, wherein the implanted germanium is in the range of from $10^{12}$ to $10^{16}$ atoms/cm$^2$.

15. The indium-implanted transistor as defined in claim 14, wherein the germanium implantation energy is from 20 to 300 keV.

16. The indium-implanted transistor as defined in claim 15, wherein $10^{-4} \leq x \leq 10^{-1}$.

17. The indium-implanted transistor as defined in claim 16, wherein the implanted indium is in the range of from $1 \times 10^{11}$ to $4 \times 10^{15}$ atoms/cm$^2$.

18. The indium-implanted transistor as defined in claim 14, further comprising the steps of:
   etching isolation trenches; and
   filling the isolation trenches with an insulating material,
   wherein the etching and filling steps are performed before the implantation of the germanium.

19. An indium-implanted transistor comprising:
   a silicon channel region that includes a buried layer of an $Si_{1-x}Ge_x$ alloy into which indium is implanted,
   wherein $10^{-5} \leq x \leq 4 \times 10^{-1}$,
   wherein the indium-implanted transistor is fabricated by a method comprising the steps of:
      producing a multilayer composite film on at least one region of a surface of a silicon substrate where the channel region of the transistor is to be formed, the multilayer composite film including at least one $Si_{1-x}Ge_x$ alloy layer, in which $10^{-5} \leq x \leq 4 \times 10^{-1}$, and an external silicon layer;
      implanting indium into the $Si_{1-x}Ge_x$ alloy layer; and
      completing fabrication of the transistor so as to produce the transistor with the channel region that includes the buried $Si_{1-x}Ge_x$ alloy layer into which the indium is implanted, and
   wherein the multilayer composite film is a three-layer film that includes a silicon layer between the surface of the substrate and the $Si_{1-x}Ge_x$ alloy layer.

20. An integrated circuit including a plurality of transistors, at least one of said transistors comprising:
   a silicon channel region that includes a buried layer of an $Si_{1-x}Ge_x$ alloy into which indium is implanted,
   wherein $10^{-5} \leq x \leq 4 \times 10^{-1}$,
   the buried layer of an $Si_{1-x}Ge_x$ alloy is part of a multilayer composite film formed on a surface of a silicon substrate, and
   the multilayer composite film includes at least the one $Si_{1-x}Ge_x$ alloy layer and an external silicon layer, the silicon layer being between the surface of the substrate and the $Si_{1-x}Ge_x$ alloy layer.

21. The integrated circuit as defined in claim 20, wherein $10^{-4} \leq x \leq 10^{-1}$.

22. The integrated circuit as defined in claim 20, wherein the implanted indium is in the range of from $1 \times 10^{11}$ to $4 \times 10^{15}$ atoms/cm$^2$.

* * * * *

UNITED STATES PATENT AND TRADEMARK OFFICE
CERTIFICATE OF CORRECTION

PATENT NO. : 6,507,091 B1
DATED : January 14, 2003
INVENTOR(S) : Thomas Skotnicki et al.

It is certified that error appears in the above-identified patent and that said Letters Patent is hereby corrected as shown below:

Title page,
Item [57], ABSTRACT,
Lines 4, 9 and 18, from "$10^{-5} \leqq x \leqq 4 \times 10^{-1}$" to -- $10^{-5} \leq x \leq 4 \times 10^{-1}$ --

Column 1,
Lines 61 and 62, from "$10^{-5} \leqq x \leqq 4 \times 10^{-1}$" to -- $10^{-5} \leq x \leq 4 \times 10^{-1}$ --

Column 2,
Lines 3 and 18, from "$10^{-5} \leqq x \leqq 4 \times 10^{-1}$" to -- $10^{-5} \leq x \leq 4 \times 10^{-1}$ --

Column 3,
Lines 2 and 20, from "$10^{-5} \leqq x \leqq 4 \times 10^{-1}$, and preferably $10^{-4} \leqq x \leqq 10^{-1}$" to -- $10^{-5} \leq x \leq 4 \times 10^{-1}$, and preferably $10^{-4} \leq x \leq 10^{-1}$ --
Line 56, from "$10^{-5} \leqq x \leqq 4 \times 10^{-1}$" to -- $10^{-5} \leq x \leq 4 \times 10^{-1}$ --
Line 57, from "$10^{-4} \leqq x \leqq 10^{-1}$" to -- $10^{-4} \leq x \leq 10^{-1}$ --

Column 5,
Line 10, from "($10^{-5} \leqq x \leqq 4 \times 10^{-1}$)" to -- ($10^{-5} \leq x \leq 4 \times 10^{-1}$) --

Column 6,
Lines 25 and 53, from "$10^{-5} \leqq x \leqq 4 \times 10^{-1}$" to -- $10^{-5} \leq x \leq 4 \times 10^{-1}$ --
Lines 35 and 61, from "$10^{-4} \leqq x \leqq 10^{-1}$" to -- $10^{-4} \leq x \leq 10^{-1}$ --

Column 7,
Line 24, from "$10^{-5} \leqq x \leqq 4 \times 10^{-1}$" to -- $10^{-5} \leq x \leq 4 \times 10^{-1}$ --
Line 38, from "$10^{-4} \leqq x \leqq 10^{-1}$" to -- $10^{-4} \leq x \leq 10^{-1}$ --

UNITED STATES PATENT AND TRADEMARK OFFICE
CERTIFICATE OF CORRECTION

PATENT NO.   : 6,507,091 B1
DATED        : January 14, 2003
INVENTOR(S)  : Thomas Skotnicki et al.

It is certified that error appears in the above-identified patent and that said Letters Patent is hereby corrected as shown below:

<u>Column 8,</u>
Lines 8, 15 and 30, from "$10^{-5} \leq x \leq 4 \times 10^{-1}$" to -- $10^{-5} \leq x \leq 4 \times 10^{-1}$ --
Line 39, from "$10^{-4} \leq x \leq 10^{-1}$" to -- $10^{-4} \leq x \leq 10^{-1}$ --

Signed and Sealed this

Eighth Day of July, 2003

JAMES E. ROGAN
*Director of the United States Patent and Trademark Office*